United States Patent [19]

Deyer

[11] Patent Number: 4,499,588

[45] Date of Patent: Feb. 12, 1985

[54] SYSTEM FOR CONVERTING THE FREQUENCY OF A PULSE TRAIN TO A BINARY NUMBER

[75] Inventor: Craig E. Deyer, Akron, Pa.

[73] Assignee: RCA Corporation, New York, N.Y.

[21] Appl. No.: 402,428

[22] Filed: Jul. 28, 1982

[51] Int. Cl.³ .................. H03K 13/20; H03K 13/256; H03K 21/36

[52] U.S. Cl. ........................ 377/42; 377/37; 377/39; 377/44; 328/130.1; 340/347 M

[58] Field of Search .......................... 328/129.1, 130.1; 377/37, 39, 44, 42; 340/347 M

[56] References Cited

U.S. PATENT DOCUMENTS

| | | | |
|---|---|---|---|
| 3,605,026 | 9/1971 | Bowden | 377/39 |
| 4,001,561 | 1/1977 | Quaintance | 377/39 |
| 4,025,868 | 5/1977 | Miki et al. | 328/129.1 |
| 4,068,179 | 1/1978 | Sample et al. | 328/130.1 |
| 4,128,756 | 12/1978 | Nagand et al. | 377/39 |
| 4,131,855 | 12/1978 | Hamagawa | 328/129.1 |
| 4,137,463 | 1/1979 | Scott et al. | 328/130.1 |
| 4,310,720 | 1/1982 | Check, Jr. | 178/22.08 |
| 4,321,695 | 3/1982 | Redwine et al. | 365/174 |

Primary Examiner—John S. Heyman
Attorney, Agent, or Firm—Eugene M. Whitacre; Dennis H. Irlbeck; Lester L. Hallacher

[57] ABSTRACT

A system for converting the frequency of a pulse train to a binary number includes an output counter which converts the pulse train to the binary number. Sampling time periods are applied as pulses to a comparator through another counter. The number of desired sampling periods is set into the comparator. The comparator enables the counter during the sampling time periods and inhibits the output counter on the termination of the total sampling time periods. The output of the output counter, therefore, is a binary representation of the frequency of the incoming pulse train during the total sampling time period.

6 Claims, 1 Drawing Figure

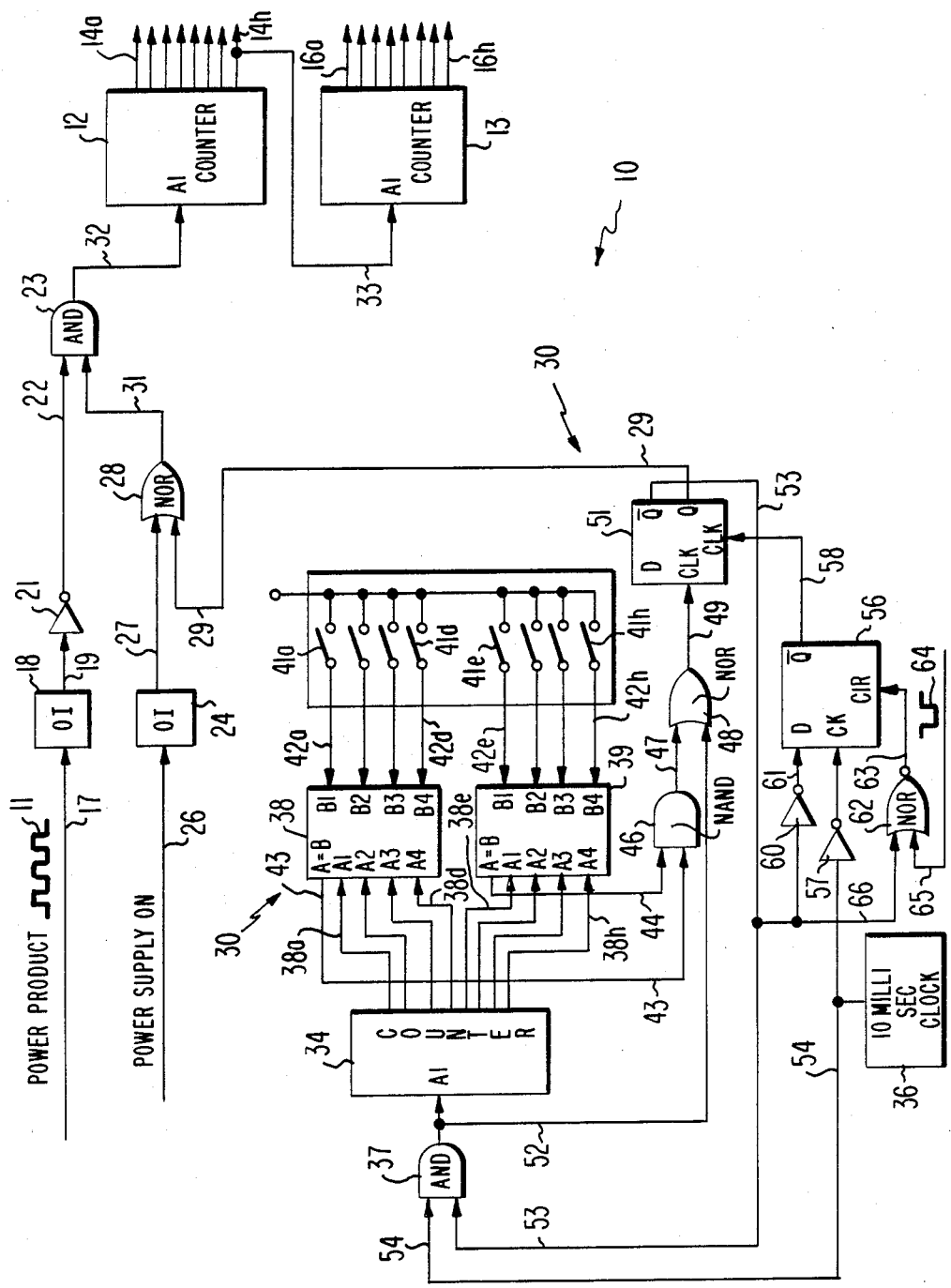

SYSTEM FOR CONVERTING THE FREQUENCY OF A PULSE TRAIN TO A BINARY NUMBER

BACKGROUND OF THE INVENTION

This invention relates generally to computer controlled systems and particularly to a system for converting the frequency of a pulse train to a binary number and providing said number to the computer of such a system.

An example of a system which requires the conversion of the frequency pulse train to a binary number is a computer controlled lighthouse which is used to expose the black matrix material on the inside surface of a color kinescope baseplate panel. In applying the black matrix to such a panel, a photosensitive black slurry material is applied to the inside of the faceplate and a shadow mask is inserted into the panel. Intense light from the lighthouse lamp passes through the apertures in the shadow mask to expose portions of the slurry. The shadow mask is subsequently removed from the panel and the unexposed material is washed away leaving a series of black lines which compose the black matrix. Uniformity of product requires that the exposure of the matrix material remain constant even though the light output of the lighthouse lamp may vary because of variations in the voltage applied to the lamp or because of degregation of the lamp. Thus, as the intensity of the lamp decreases, the length of time that the slurry is exposed to the light must be increased to maintain a constant light intensity/time multiple. Conversely, if the intensity of the lamp increases, the exposure time must be proportionately decreased to maintain a constant intensity/time multiple. One method of maintaining a constant intensity/time multiple is to monitor the intensity of the lamp and provide a pulse train the frequency of which varies along with the lamp intensity. The pulse train frequency changes are detected and used as a measure of the exposure time adjustment needed to maintain a constant intensity/time multiple.

An example of a system which operates in this manner is described in Patent Application Ser. No. 267,750 filed May 28, 1981 by William R. Kelly and Ernesto J. Alvero and entitled "System and method For Controlling The Exposure Of Color Picture Tube Phosphor Screens", now U.S. Pat. No. 4,436,394. In the system described in this patent application, the changes in the frequency of a pulse train occasioned by variations in lamp intensity are processed within the lighthouse control system and used to adjust the exposure time. This results in some disadvantage because the frequency must be converted to a binary number to which the computer can respond. Making the conversion internally of the control system consumes control system time and calculating capability and thus preferably should be made external of the control system.

The instant invention overcomes this disadvantage by the provision of a system for converting a frequency to a binary number representative of the frequency and supplying the binary number to the computer of a computer controlled system.

CROSS REFERENCES TO RELATED PATENT APPLICATIONS

The following patent applications, filed of even date herewith by Craig E. Deyer, describe systems which can be used in a computer controlled system employing the instant invention.

Application Ser. No. 402,546 entitled "Switch Arrangement For Accessing A computer".

Application Ser. No. 402,544 entitled "System For Inputting A Selective One Of A Plurality of Inputs To A Computer".

Application Ser. No. 402,545 entitled "System For Providing Multi-Bit Input To A Computer Controlled System".

Application Ser. No. 402,426 entitled "System For Inputting A Security Code To A Computer".

The instant invention is an improvement of the invention described in Application Ser. No. 267,750 filed May 28, 1981 now U.S. Pat. No. 4,436,394 by William R. Kelly and Ernest J. Alvero.

Application Ser. No. 267,991 entitled "System And Method For Intermittently Moving A Picture Tube Panel On A Lighthouse, now U.S. Pat. No. 4,370,036, and Application Ser. No. 267,749 entitled "System and Method For Determining The Light Transmission Characteristics of Color Picture Tube Shadow Masks", now U.S. Pat. No. 4,416,521 both filed on May 28, 1981 by William R. Kelly and Ernest J. Alvero describe a lighthouse control system which can receive access commands from the instant invention.

SUMMARY OF THE INVENTION

A system for converting the frequency of a pulse train to a binary number includes logic responsive to the pulse train and an output counter responsive to the output logic. The counter provides binary numbers representative of the pulse train frequency. A timing means sets sampling time periods. An enabling means selects a desired number of sampling time periods and enables the input logic during the sampling time periods.

BRIEF DESCRIPTION OF THE DRAWINGS

The FIGURE is a block diagram of a preferred embodiment of the instant invention.

DETAILED DESCRIPTION OF THE PREFERRED EMBODIMENT

In the FIGURE, the system 10 converts the frequency of the input pulse train 11 into a binary number. The binary number is available on output lines 14a–14h and 16a–16h of binary counters 12 and and 13, respectively. The output lines 14a–14h and 16a–16h of the counters 12 and 13 serve as input lines to the control system computer (not shown) so that a 16-bit binary number is provided to the system. The pulse train 11 has a frequency which varies in accordance with the intensity of the lamp used in the lighthouse. This pulse train is generated in a manner described in Application Ser. No. 267,750 the disclosure of which is incorporated by reference herein. The pulse train 11 is provided by an input line 17 to an opto-isolator 18 which isolates the output logic circuitry from the noise of the other portions of the system. The optoisolator 18 switches on and off in response to the pulse train 11. The opto-isolator 18 inverts the pulse train and the pulse train complement is available on the output line 19. The complement pulse train output of the isolator 18 is inverted back to the original pulse train by an inverter 21 and the input line 22 applies the pulse train to one input terminal of an AND Gate 23. The AND Gate 23 passes the pulse train to an output line 32 when the other input terminal receives a high from an input line 31. A "power supply on" signal is received by another opto-isolator 24 from an input line 26 and the output line 27 is normally low. The line 27 is coupled to one input terminal of a NOR Gate 28. The other input terminal of the NOR Gate 28 receives a normally low enable signal from an enabling logic circuit 30 from a line 29. The input line 31 to the AND Gate 23 is responsive to the output of the NOR Gate 28 and is normally high. With the input line 31 high, the AND Gate 23 is enabled and the power product signal 11 passes through the AND Gate 23 to the A-1 terminal of the counter 12. Each pulse of the pulse train 11 increases the binary output by one count and the frequency of the pulse train 11 is available as a 16-bit binary number across the output terminals 14a–14h and 16a–16h of the counters 12 and 13 when the AND Gate 23 is inhibited by the NOR Gate 28 in a manner described hereinafter. The output line 14h of the counter 12 is coupled by a line 33 to the A1 input terminal of the counter 13. This line makes a high to low transition when the counter 12 fills up. Accordingly, the counter 12 provides the first eight bits of the 16-bit output and the counter 13 provides the last eight bits of the binary output.

The enabling logic circuit 30 includes a binary counter 34 the A1 input terminal of which is enabled by a 10 milli-second clock through an AND Gate 37. The 10 milli-second clock 36 can be a free-running multivibrator which is set to time out in 10 mili-seconds, for example. Thus, the counter 34 makes one count every 10 milli-seconds. Output lines 38a–38d of the counter 34 are coupled to the A1-A4 input terminals of a 4-bit binary comparator 38. The output lines 38e–38h of the counter 34 are coupled to the A1-A4 input terminals of a similar 4-bit binary comparator 39. The counters 12, 13 and 34 are commercially available and can be, for example, Texas Instruments 74LS393 counters. The comparators also are commercially available and can be, for example, Texas Instruments 74LS85 comparators. A switch arrangement 41 includes a plurality of switches 41a–41h. The switches 41a–41d are coupled to the B1-B4 input terminals of the comparator 38 by the lines 42a–42d. The switches 41e–41h are coupled to the B1-B4 input terminals of the comparator 39 by the lines 42e–42h. The comparators 38 and 39 operate such that when the inputs from the counter 34 available on the A input terminals equal the inputs received on the B input terminals from the switch 41, the A=B output terminals of the comparators 38 and 39 go from normally low to high. The A=B output terminals of the comparators 38 and 39 are connected by lines 43 and 44 respectively to the input terminals of a NAND Gate 46. The output line 47 of the NAND Gate 46 is coupled to one input terminal of NOR Gate 48. The output terminal of the NOR Gate 48 is coupled by a line 49 to the clock input of a D-type flip-flop 51. The other input terminal of the NOR Gate 48 is coupled to the output of the AND Gate 37 by a line 52. The $\overline{Q}$ output of the flip-flop 51 is coupled by a line 53 to one input terminal of the AND Gate 37. The other input terminal of the AND Gate 37 receives the sampling time periods from the clock circuit 36 by way of a line 54. The output of the timing circuit 36 also is coupled to the clock input terminal of a D-type flip-flop 56 through an inverter 57. The $\overline{Q}$ output of the clear logic flip-flop 56 is coupled by a line 58 to clear input of the flip-flop 51.

The number of 10 milli-second sampling time periods during which the counters 12 and 13 can count the frequency of the input pulse train 11 is determined by the settings of the switches 41a–41h of the switch arrangement 41. Thus, for example, eight 10 milli-second sampling periods can be selected by setting the binary number eight into the comparators 38 and 39 by closing the binary eight combination of switches. When the A inputs to the comparators 38 and 39 from the counter 34 are different from the B inputs from the switches 42, the A=B output terminals of the comparators are low. These output terminals are coupled by the lines 43 and 44 to the input terminals of a NAND Gate 46. Accordingly, the output line 47 of the NAND Gate 46 is normally high. The output of the NOR Gate 48 therefore is normally low and the $\overline{Q}$ output of the flip-flop 51 is normally high. The AND Gate 37 is enabled by the high $\overline{Q}$ output and the sampling time periods from the timing circuit 36 are passed by the AND Gate 37 to the counter 34. The first 10 milli-second pulse from the clock 36 causes the output lines 38a to 38h indicate a binary one to the A input terminals of the comparators 38 and 39. Each of the subsequent 10 milli-second timing periods from the timing circuit 36 increment the output lines 38a to 38h of the binary counter 34 one count. When the A input terminals of the comparators 38 and 39 have received from the counter 34 a number of pulses equal to the number set onto the B input terminals by the switching arrangement 41, the A=B output terminals of the two comparators and the lines 43 and 44 go high. The NAND Gate 46 is inhibited and the line 47 which is coupled to the output terminal of the NAND gate 46 goes low. The line 52 is also low because the clock 36 is between timing pulses. The lows on the lines 47 and 52 change the output line 49 of the NOR Gate 48 from low to high to trigger the flip-flop 51. The $\overline{Q}$ output, of the flip-flop 51 and the line 53 go from high to low to inhibit the AND Gate 37 and the sampling time period signals from the clock 36 no longer increment the counter 34. Upon the triggering of the flip-flop 51, the Q output and the line 29 go from low to high. The high on the line 29 is applied to an input terminal of the NOR Gate 28, and causes the input line 31 to the AND Gate 23 to go from high to low. The low on the line 31 inhibits the AND Gate 23 and prevents the pulse train 11 from passing to the counters 12 and 13. Accordingly, the output of the counters 12 and 13 is a binary representation of the frequency of the pulse train 11 during the total sampling period established by the setting of the switches 41a to 41h.

The flip-flop 56, an inverter 60, a NOR Gate 62 and a clear line 65 are used to restart the sampling process so that continuous sampling can be used. After the being read, the counters 12, 13 and 34 are reset to zero and the A=B output terminals of the comparators 38 and 39 go low. Sampling does not restart because flip-flop 51 is set. After the counters 12 and 13 are read by the computer, a low restart sample pulse 64 is supplied by the control system to one input terminal of a NOR Gate 62 over the line 65. The other input terminal of the NOR Gate 62 is coupled by lines 66 and 53 to the low $\overline{Q}$ output of flip-flop 51. The restart pulse 64, therefore, causes the output line 63 of the NOR Gate 62 to go high and enable the flip-flop 56. The next clock pulse from the clock 36 is passed by the inverter 57 to the clock input of the flip-flop 56. The high on the output line 61 of the inverter 60 passes to the Q output of the flip-flop 56 causing the $\overline{Q}$ output and line 58 to go low to enable reset flip-flop 51 over line 58. When flip-flop 51 resets the Q output and line 29 go low to enable NOR Gate 28 and the $\overline{Q}$ output and line 53 go high to enable AND Gate 37. The timing pulses from the clock 36 are again passed to the counter 34 and the power product pulses 11 are passed to the counters 12 and 13. When the $\overline{Q}$ output of flip-flop 51 and line 53 go low, line 66 also goes low and the output line 63 of the NOR Gate 62 goes low to clear the flip-flop 56. The restarting of the sampling by the timing pulses from the clock 36 is advantageous because a well defined constant start is realized and accurate samples are obtained.

I claim:

1. A system for converting the frequency of a pulse train to a binary number and providing said binary number to a computer controlled system comprising:

input logic means responsive to said pulse train for providing frequency pulses;

output counter means responsive to said frequency pulses for providing binary numbers representative of the number of frequency pulses received;

timing means for setting sampling time periods;

enabling means for selecting a desired number of said sampling time periods and for enabling said logic means during said sampling time periods whereby said counter means provides said binary number representative of the frequency of said pulse train during said sampling time periods;

said enabling means including comparator means; means for setting said desired number of sampling periods into said comparator, and second counter means responsive to said timing means for providing said sampling periods to said comparator means whereby said comparator means provides an inhibit signal to said logic means between said sampling periods; and bistable enabling logic arranged between said comparator means and said logic means, whereby said bistable enabling logic enables said logic means during said sampling time periods and inhibits said logic means between sampling time periods.

2. The system of claim 1 wherein said means for setting includes a plurality of switches for setting numbers into said comparator.

3. The system of claim 2 wherein said second counter means is a binary counter and wherein said timing means provides pulses to said binary counter during said sampling periods.

4. The system of claim 3 further including multi-terminal logic means arranged between said timing means and said second counter, said multi-terminal logic means being conjunctively responsive to said timing means and to said bistable enabling logic whereby said second counter is set when said bistable enabling logic inhibits said logic means.

5. The system of claim 4 further including clear logic arranged between said timing means and said bistable enabling logic whereby said clear logic clears said bistable logic means between said sampling time periods.

6. The system of claim 5 wherein said clear logic and said bistable enabling logic include D-type flip-flops.

* * * * *